US012590249B2

(12) United States Patent
Kim et al.

(10) Patent No.: US 12,590,249 B2
(45) Date of Patent: Mar. 31, 2026

(54) ETCHANT COMPOSITION

(71) Applicant: SAMSUNG ELECTRONICS CO., LTD., Suwon-si (KR)

(72) Inventors: Jung-ah Kim, Hwaseong-si (KR); Young-chan Kim, Suwon-si (KR); Hyo-san Lee, Hwaseong-si (KR); Hoon Han, Anyang-si (KR); Jin-uk Lee, Sejong-si (KR); Jung-hun Lim, Daejeon (KR); Ik-hee Kim, Gongju-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 664 days.

(21) Appl. No.: 17/496,174

(22) Filed: Oct. 7, 2021

(65) Prior Publication Data

US 2022/0025261 A1 Jan. 27, 2022

Related U.S. Application Data

(63) Continuation of application No. 16/565,690, filed on Sep. 10, 2019, now Pat. No. 11,142,694.

(30) Foreign Application Priority Data

Jan. 8, 2019 (KR) ........................ 10-2019-0002397

(51) Int. Cl.
*C09K 13/06* (2006.01)
*C09K 13/04* (2006.01)
(Continued)

(52) U.S. Cl.
CPC ........... *C09K 13/04* (2013.01); *H10D 84/016* (2025.01); *H10D 84/038* (2025.01);
(Continued)

(58) Field of Classification Search
CPC ......... H01L 21/31105; H01L 21/31111; C09K 13/04; C09K 13/06
See application file for complete search history.

(56) References Cited

U.S. PATENT DOCUMENTS 6,964,600 B2 11/2005 Belov et al.
9,305,792 B2 4/2016 Hong et al.
(Continued)

FOREIGN PATENT DOCUMENTS

CN 1637110 A 7/2005
CN 103069049 A 4/2013
(Continued)

OTHER PUBLICATIONS

Peace et al. ("Polymers from the hydrolysis of tetraethoxysilane", Polymer, 1973, vol. 14, September, p. 420-423).*
(Continued)

*Primary Examiner* — Thomas T Pham
(74) *Attorney, Agent, or Firm* — Muir Patent Law, PLLC

(57) ABSTRACT

An etchant composition and a method of fabricating a semiconductor device, the composition including an inorganic acid; about 0.01 parts by weight to about 0.5 parts by weight of colloidal silica; about 0.01 parts by weight to about 30 parts by weight of an ammonium-based additive; and about 20 parts by weight to about 50 parts by weight of a solvent, all parts by weight being based on 100 parts by weight of the inorganic acid.

16 Claims, 12 Drawing Sheets

(51) Int. Cl.

| | |
|---|---|
| ***H10D 84/01*** | (2025.01) |
| ***H10D 84/03*** | (2025.01) |
| ***H10P 50/28*** | (2026.01) |
| ***H10P 70/00*** | (2026.01) |
| *H10B 41/27* | (2023.01) |
| *H10B 43/27* | (2023.01) |

(52) U.S. Cl.

CPC ............ *H10P 50/283* (2026.01); *H10P 70/23* (2026.01); *H10P 70/80* (2026.01); *H10B 41/27* (2023.02); *H10B 43/27* (2023.02)

(56) References Cited

U.S. PATENT DOCUMENTS

| | | | |
|---|---|---|---|
| 9,583,359 | B2 | 2/2017 | Mishra et al. |
| 9,620,515 | B2 | 4/2017 | Nagashima et al. |
| 9,803,106 | B2 | 10/2017 | Grumbine et al. |
| 2002/0018755 | A1 | 2/2002 | Jia et al. |
| 2005/0159011 | A1 | 7/2005 | Thirumala et al. |
| 2006/0196778 | A1* | 9/2006 | Jia ......................... B24B 37/042 205/640 |
| 2009/0314744 | A1* | 12/2009 | Vacassy ............... C09K 3/1436 252/79.1 |
| 2011/0250755 | A1* | 10/2011 | Morinaga ............. B24B 37/042 438/693 |
| 2012/0003901 | A1* | 1/2012 | Hu .................... H01L 21/76819 451/36 |
| 2013/0092872 | A1 | 4/2013 | Hong et al. |
| 2014/0290859 | A1 | 10/2014 | Kobayashi et al. |
| 2015/0111311 | A1 | 4/2015 | Changchien et al. |
| 2015/0348799 | A1 | 12/2015 | Hong et al. |
| 2015/0372073 | A1 | 12/2015 | Menath et al. |
| 2016/0017224 | A1 | 1/2016 | Lee et al. |
| 2016/0064500 | A1 | 3/2016 | Chen et al. |
| 2016/0126107 | A1 | 5/2016 | Kil et al. |
| 2017/0287725 | A1 | 10/2017 | Rotondaro et al. |
| 2017/0287726 | A1 | 10/2017 | Bassett et al. |
| 2017/0355881 | A1* | 12/2017 | Tamai ..................... B24B 37/00 |
| 2017/0362465 | A1 | 12/2017 | Ashitaka et al. |
| 2018/0057711 | A1 | 3/2018 | Onishi et al. |
| 2018/0142151 | A1 | 5/2018 | Lee et al. |
| 2018/0258319 | A1 | 9/2018 | Akutsu et al. |
| 2019/0010358 | A1* | 1/2019 | Iwata ..................... C09K 13/00 |
| 2019/0122905 | A1 | 4/2019 | Ohno et al. |
| 2019/0122906 | A1 | 4/2019 | Zhang et al. |
| 2019/0136090 | A1 | 5/2019 | Park et al. |
| 2019/0211227 | A1* | 7/2019 | Dockery ............... B24B 37/044 |
| 2020/0010726 | A1* | 1/2020 | Guo .................... H01L 21/3212 |
| 2020/0123413 | A1* | 4/2020 | Ishibashi ........... H01L 21/30625 |
| 2020/0152489 | A1 | 5/2020 | Inada et al. |
| 2020/0165487 | A1* | 5/2020 | So ........................... C09G 1/02 |
| 2020/0194280 | A1 | 6/2020 | Konishi et al. |
| 2021/0054286 | A1 | 2/2021 | Lim et al. |

FOREIGN PATENT DOCUMENTS

| | | | |
|---|---|---|---|
| CN | 103980905 | A | 8/2014 |
| CN | 105273718 | A | 1/2016 |
| CN | 105573052 | A | 5/2016 |
| CN | 108102654 | A | 6/2018 |
| CN | 108291132 | A | 7/2018 |
| CN | 108885989 | A | 11/2018 |
| JP | 5927806 | B2 | 6/2016 |
| KR | 10-2013-0010826 | A | 1/2013 |
| KR | 10-1388106 | B1 | 4/2014 |
| KR | 10-2014-0082222 | A | 7/2014 |
| KR | 10-2015-0109089 | A | 10/2015 |
| KR | 10-2016-0010312 | A | 1/2016 |
| KR | 10-2018-0058610 | A | 6/2018 |
| WO | WO 2018-124705 | A1 | 7/2018 |

OTHER PUBLICATIONS

Kaur et. al. (“Hydrolysis and Condensation of Tetraethyl Orthosilicate at the Air-Aqueous Interface: Implications for Silica Nanoparticle Formation”, ACS Appl. Nano Mater. 2022, 5, 411-422).*

Wikipedia (“Stober process”, published May 11, 2018).*

“Food Additives”, Hao Liping, China Agricultural University Press, p. 234.

* cited by examiner

ETCHANT COMPOSITION

CROSS-REFERENCE TO RELATED APPLICATIONS

This is a continuation application based on pending application Ser. No. 16/565,690, filed Sep. 10, 2019, the entire contents of which is hereby incorporated by reference.

Korean Patent Application No. 10-2019-0002397, filed on Jan. 8, 2019, in the Korean Intellectual Property Office, and entitled: "Etchant Composition for Silicon Nitride and Method of Fabricating Semiconductor Device," is incorporated by reference herein in its entirety.

BACKGROUND

1. Field

Embodiments relate to an etchant composition and a method of fabricating a semiconductor device.

2. Description of the Related Art

As semiconductor devices are highly integrated, it may be difficult to apply batch-type processes due to an increase in the number of layers in which individual devices are stacked. In addition, economic efficiency in single-type processes due to low throughput may be a concern, and methods of improving the productivity of single-type processes may be considered.

SUMMARY

The embodiments may be realized by providing an etchant composition including an inorganic acid; about 0.01 parts by weight to about 0.5 parts by weight of colloidal silica; about 0.01 parts by weight to about 30 parts by weight of an ammonium-based additive; and about 20 parts by weight to about 50 parts by weight of a solvent, all parts by weight being based on 100 parts by weight of the inorganic acid.

The embodiments may be realized by providing a method of fabricating a semiconductor device, the method including forming a structure on a substrate, the structure having an exposed surface of a silicon oxide layer and an exposed surface of a silicon nitride layer; and selectively etching the exposed silicon nitride layer by using an etchant composition, wherein the etchant composition includes an inorganic acid, about 0.01 parts by weight to about 0.5 parts by weight of colloidal silica having an average particle size of about 1 nm to about 40 nm; about 0.01 parts by weight to about 30 parts by weight of an ammonium-based additive; and about 20 parts by weight to about 50 parts by weight of a solvent, all parts by weight being based on 100 parts by weight of an inorganic acid.

The embodiments may be realized by providing a method of fabricating a semiconductor device, the method including forming, on a substrate, a structure in which a plurality of silicon oxide layers and a plurality of silicon nitride layers are alternately stacked one by one; forming a cut region by partially removing each of the plurality of silicon oxide layers and the plurality of silicon nitride layers, the cut region having a sidewall at which the plurality of silicon oxide layers and the plurality of silicon nitride layers are exposed; and selectively removing the plurality of silicon nitride layers out of the plurality of silicon oxide layers and the plurality of silicon nitride layers through the cut region by bringing an etchant composition into contact with the structure, wherein the etchant composition includes an inorganic acid, about 0.01 parts by weight to about 0.5 parts by weight of colloidal silica having an average particle size of about 1 nm to about 40 nm; about 0.01 parts by weight to about 30 parts by weight of an ammonium-based additive; and about 20 parts by weight to about 50 parts by weight of a solvent, all parts by weight being based on 100 parts by weight of an inorganic acid.

The embodiments may be realized by providing a method of fabricating a semiconductor device, the method including forming a structure in which a plurality of silicon oxide layers and a plurality of silicon nitride layers are alternately stacked one by one on a substrate in a deposition chamber; forming a cut region by partially removing each of the plurality of silicon oxide layers and the plurality of silicon nitride layers in a dry etching chamber such that the cut region has a sidewall at which the plurality of silicon oxide layers and the plurality of silicon nitride layers are exposed; and selectively removing the plurality of silicon nitride layers out of the plurality of silicon oxide layers and the plurality of silicon nitride layers through the cut region by bringing an etchant composition into contact with the structure in a wet etching chamber, wherein the etchant composition includes a phosphoric acid solution including colloidal silica and an ammonium-based additive, and selectively removing the plurality of silicon nitride layers is performed at a temperature of about 200° C. to about 300° C.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
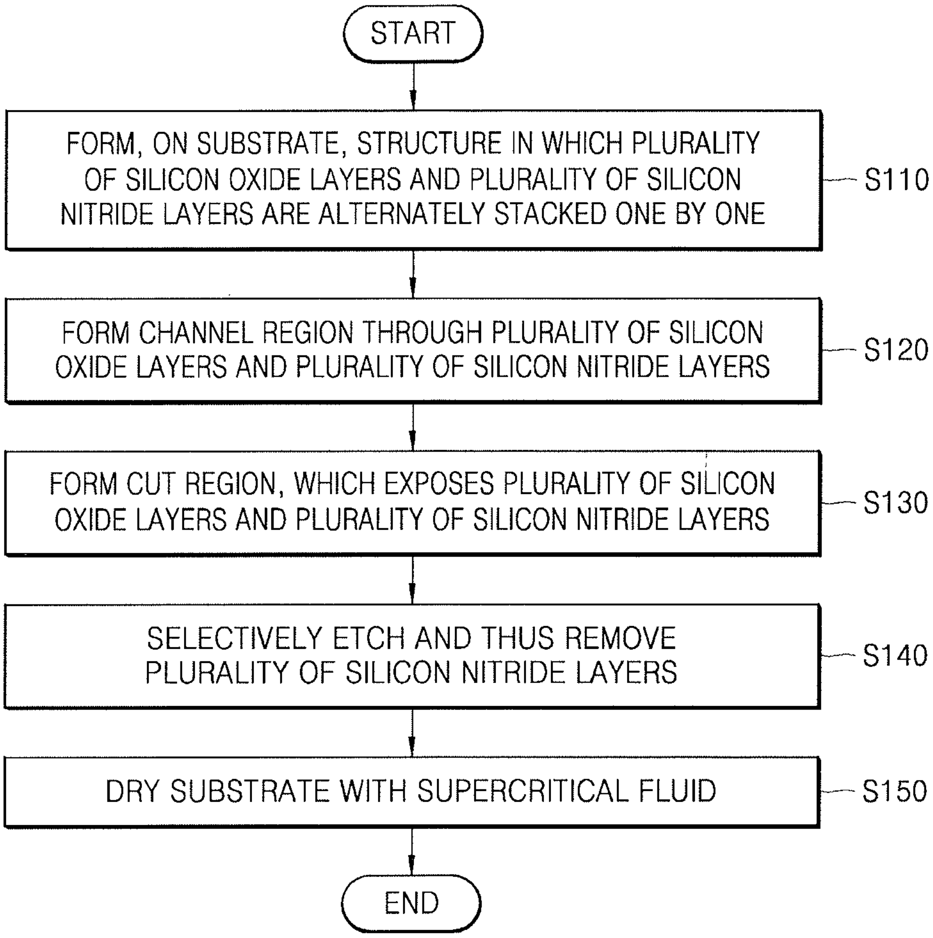
FIG. 1 illustrates a flowchart of a method of fabricating a semiconductor device, according to embodiments.

According to an embodiment, an etchant composition, e.g., for etching silicon nitride, may include an inorganic acid, a solvent, an ammonium-based additive, and particles of colloidal silica. The ammonium-based additive and the colloidal silica may be dissolved or dispersed in a mixture of the inorganic acid and the solvent.

Inorganic Acid

The inorganic acid may include, e.g., phosphoric acid, sulfuric acid, nitric acid, silicic acid, hydrofluoric acid, boric acid, hydrochloric acid, perchloric acid, or a mixture thereof. In an implementation, the inorganic acid may include, e.g., phosphoric acid. In the etchant composition, the inorganic acid may accelerate etching of a silicon nitride layer by providing hydrogen ions. In an implementation, the inorganic acid may include, e.g., a mixture of phosphoric acid and sulfuric acid. Sulfuric acid may accelerate etching of a silicon nitride layer by increasing the boiling point of the etchant composition including phosphoric acid.

Solvent

In an implementation, the solvent may include a suitable polar aqueous solvent, e.g., deionized water.

In an implementation, the etchant composition may include, e.g., about 20 parts by weight to about 50 parts by weight of the solvent, based on 100 parts by weight of the inorganic acid. In an implementation, the etchant composition may include, e.g., about 30 parts by weight to about 45 parts by weight of the solvent, based on 100 parts by weight of the inorganic acid. In an implementation, the etchant composition may include, e.g., about 35 parts by weight to about 43 parts by weight of the solvent, based on 100 parts by weight of the inorganic acid.

If the amount of the solvent is too high or too low, it may be difficult to maintain an appropriate pH of the etchant composition. Specifically, if the amount of the solvent is too low, an etch selectivity of silicon nitride relative to silicon oxide may be insufficient due to an excess of acidity. On the contrary, if the amount of the solvent is too high, an etch rate of silicon nitride may be low and there is a concern of particle generation.

Colloidal Silica

In an implementation, the etchant composition may include, e.g., about 0.01 parts by weight to about 0.5 parts by weight of the colloidal silica, based on 100 parts by weight of the inorganic acid. If the amount of the colloidal silica is too low, the etch selectivity of silicon nitride relative to silicon oxide may be insufficient. If the amount of the colloidal silica is too high, there may be a drawback in economic efficiency due to the saturation of an effect of improving the etch selectivity.

The colloidal silica may be present in the form of particles at room or ambient temperature. The colloidal silica particles may have an average particle size of about 1 nm to about 40 nm. Herein, the "particle size" may be represented by or refer to a maximum length of a particle. If the average particle size of the colloidal silica is too small, the colloidal silica may be likely to agglomerate and thus may exhibit deteriorated dispersibility. If the average particle size of the colloidal silica is too large, it may take a long time to dissolve the colloidal silica.

The colloidal silica particles may be dissolved in an acidic atmosphere (e.g., solution) having a high temperature.

In an implementation, the colloidal silica particles may be dissolved in the inorganic acid at a temperature of at least about 200° C., e.g., about 200° C. to about 300° C. At a temperature lower than this temperature, the colloidal silica particles may not be dissolved or may be dissolved only by as much as a limited amount. In an implementation, the colloidal silica particles may be dissolved in the inorganic acid at a temperature of about 230° C. to about 250° C.

The acidic atmosphere may have a pH of about 1 or less. If the solution were to have a pH higher than 1, e.g., a pH of 2 or more, 3 or more, 4 or more, 5 or more, 6 or more, 7 or more, 8 or more, or 10 or more, the colloidal silica particles may never be dissolved or may be dissolved only by as much as a tiny amount, despite increasing the temperature.

When the colloidal silica particles are dissolved in the acidic atmosphere having a high temperature, the colloidal silica having a structure represented by Chemical Formula 1 may be distributed in the etchant composition.

[Chemical Formula 1]

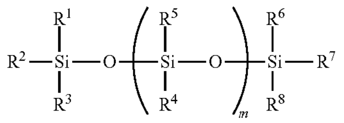

In Chemical Formula 1, m may be, e.g., an integer of 2 to 8, and $R^1$, $R^2$, $R^3$, $R^4$, $R^5$, $R^6$, $R^7$, and $R^8$ may each independently be, e.g., a hydrogen atom, a hydroxyl group, or a substituent represented by Chemical Formula 2.

[Chemical Formula 2]

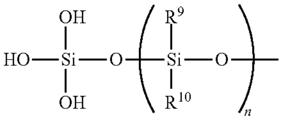

In Chemical Formula 2, n may be, e.g., an integer of 0 to 5, and $R^9$ and $R^{10}$ may each independently be, e.g., a hydrogen atom, a hydroxyl group, a C1 to C20 alkyl group, a C2 to C20 alkenyl group, a C2 to C20 alkynyl group, a C1 to C20 hydroxyalkyl group, a C1 to C20 aminoalkyl group, a C1 to C20 alkoxy group, a C1 to C20 aminoalkoxy group, a phosphate group, a sulfate group, a nitrile group, or a carboxyl group.

As used herein, the term "C1 to C20 alkyl group" refers to a linear or branched noncyclic saturated aliphatic hydrocarbon group having 1 to 20 carbon atoms. As used herein, the term "C2 to C20 alkenyl group" refers to a linear or branched noncyclic unsaturated aliphatic hydrocarbon group having 2 to 20 carbon atoms, wherein adjacent carbon atoms have one or more double bonds therebetween. As used herein, the term "C2 to C20 alkynyl group" refers to a linear or branched noncyclic unsaturated aliphatic hydrocarbon group having 2 to 20 carbon atoms, wherein adjacent carbon atoms have one or more triple bonds therebetween. As used herein, the term "C1 to C20 alkoxy group" refers to a linear or branched noncyclic saturated or unsaturated aliphatic hydrocarbon group having one or more ether groups and 1 to 20 carbon atoms.

In an implementation, the colloidal silica particles may be commercially available and may include, e.g., LUDOX(R) (Merck Co., Ltd.), Lavasil (Nouryon Co., Ltd.), YGS-series (Young-il Chemical Co. Ltd.), or the like.

Without being bound by theory, the colloidal silica generated by dissolving the colloidal silica particles may cover a surface of silicon oxide and thus may help suppress the silicon oxide from being etched and removed. A surface of silicon oxide may be terminated with hydrogen or a hydroxyl group, and this hydrogen or hydroxyl group may be bonded to a hydroxyl group of the colloidal silica. In addition, the colloidal silica may have several hydroxyl groups, and the colloidal silica may form a relatively strong bond with the surface of the silicon oxide. As a result, the colloidal silica may maintain the bond with the surface of the silicon oxide even at a relatively high temperature. Thus, a high etch selectivity between the silicon oxide and silicon nitride may be secured by protecting the silicon oxide from being etched as the silicon nitride is etched and removed.

Ammonium-Based Additive

In an implementation, the etchant composition may include, e.g., about 0.01 parts by weight to about 30 parts by weight of the ammonium-based additive, based on 100 parts by weight of the inorganic acid. In an implementation, the etchant composition for silicon nitride may include, e.g., about 0.1 parts by weight to about 20 parts by weight of the ammonium-based additive, based on 100 parts by weight of the inorganic acid. In an implementation, the etchant composition for silicon nitride may include, e.g., about 0.3 parts by weight to about 15 parts by weight of the ammonium-based additive, based on 100 parts by weight of the inorganic acid.

If the amount of the ammonium-based additive is too low, an effect of maintaining a constant etch selectivity of silicon nitride relative to silicon oxide may be reduced in the case of using the etchant composition for a long period of time. On the contrary, if the amount of the ammonium-based additive is too high, an etch rate of each of the silicon nitride and the silicon oxide may vary, and thus, the etch selectivity set forth above may be changed.

In an implementation, the ammonium-based additive may include, e.g., ammonium hydroxide, ammonium chloride, ammonium acetate, ammonium phosphate, ammonium peroxydisulfate, ammonium sulfate, an ammonium hydrofluoric acid salt, ammonia, or a mixture thereof.

Amine Compound, Azole Compound, or Nitrate Compound

In an implementation, the etchant composition may further include an amine compound, an azole compound, or a nitrate compound (e.g., alone or combinations thereof). These amine, azole, and nitrate compounds may help protect a silicon substrate from being etched by bonding to a surface at which silicon is exposed.

Without being bound by theory, a silicon surface may be terminated with hydrogen and the amine, azole, and nitrate compounds may help suppress silicon from being etched by bonding to hydrogen and thus covering the silicon surface.

In an implementation, the etchant composition may include, e.g., about 0.01 parts by weight to about 10 parts by weight of the amine compound, azole compound, or nitrate compound, based on 100 parts by weight of the inorganic acid. If the amount of the at least one selected from the group consisting of amine, azole, and nitrate compounds is too low, an effect of suppressing the etching of silicon may be insufficient. If the amount of the at least one selected from the group consisting of amine, azole, and nitrate compounds is too high, there may be a drawback in economic efficiency due to the saturation of the effect of suppressing the etching of silicon.

In an implementation, the amine compound may include, e.g., methylamine, dimethylamine, trimethylamine, ethylamine, diethylamine, triethylamine, methylethylamine, propylamine, isopropylamine, 2-aminopentane, methylethanolamine, triphenylamine, naphthylamine, anthracenylamine, 9-methyl-anthracenylamine, diphenylamine, ditolylamine, N-phenyltolylamine, N-dimethylfluorenyltriphenyleneamine, N-triphenylenyldibenzofuranamine, N-triphenylenyldibenzothiopheneamine, N-phenyltriphenyleneamine, N-biphenyldimethylfluoreneamine, N-biphenyldibenzofuranamine, N-biphenyldibenzothiopheneamine, N-biphenylphenylcarbazoleamine, N-biphenyltriphenyleneamine, N-naphthyltriphenyleneamine, N-phenyldiphenylfluoreneamine, N-biphenylspirobifluoreneamine, N-phenylspirobifluoreneamine, N-naphthylspirobifluoreneamine, N-naphthyldiphenylfluoreneamine, N-phenyldimethylfluoreneamine, N-naphthyldimethylfluoreneamine, N-phenyldibenzofuranamine, N-biphenyldiphenylfluoreneamine, N-phenylbiphenylamine, N-naphthyldibenzofuranamine, N-naphthylphenylcarbazoleamine, N-naphthyldibenzothiopheneamine, N-phenyldibenzothiopheneamine, N-phenylphenylcarbazoleamine, dinaphthylamine, N-phenylnaphthaleneamine, or a combination thereof.

In an implementation, the azole compound may include, e.g., imidazole, pyrazole, 1,2,3-triazole, 1,2,4-triazole, tetrazole, pentazole, oxazole, isoxazole, 1,2,4-oxadiazole, 1,2,5-oxadiazole, 1,3,4-oxadiazole, thiazole, isothiazole, 1,2,3-thiadiazole, 1,2,4-thiadiazole, 1,2,5-thiadiazole, 1,3,4-thiadiazole, or a combination thereof.

In an implementation, the nitrate compound may include, e.g., an organic nitrate or an inorganic nitrate. In an implementation, the organic nitrate may include, e.g., dialkyl imidazolium nitrate, guanidine nitrate, ethyl nitrate, propyl nitrate, butyl nitrate, pentyl nitrate, octyl nitrate, glycol dinitrate, diethylene glycol dinitrate, pyridine nitrate, or the like. In an implementation, the inorganic nitrate may include, e.g., lithium nitrate, potassium nitrate, aluminum nitrate, cupric nitrate, ferric nitrate, zinc nitrate, cerous nitrate, cesium nitrate, barium nitrate, silver nitrate, ammonium nitrate, or the like.

Others

In an implementation, the etchant composition may further include a fluorine compound. The fluorine compound may include, e.g., hydrogen fluoride, ammonium fluoride, ammonium hydrogen fluoride, or a combination thereof. The fluorine compound may help increase an etch rate of silicon nitride.

In an implementation, the fluorine compound may be present in an amount of about 0.01% by weight (wt %) to about 1 wt %, based on a total weight of the etchant composition. If the amount of the fluorine compound is too low, the removal of silicon nitride may not be facilitated due to a low etch rate of the silicon nitride, and if the amount of the fluorine compound is too high, although the etch rate of the silicon nitride may be significantly improved, silicon oxide, which, together with the silicon nitride, is exposed to the etchant composition, may also be etched.

In an implementation, the etchant composition for silicon nitride may further include, e.g., a surfactant, a sequestering agent, a metal corrosion inhibitor, or combinations thereof.

The surfactant may function to remove etched residues while silicon nitride is etched by using the etchant composition. The surfactant may include, e.g., an anionic surfactant, a cationic surfactant, a nonionic surfactant, or a combination thereof. In an implementation, the surfactant may include, e.g., cetyltrimethylammonium chloride (CTAC), dodecyltrimethylammonium chloride (DTAC), monoethanolamine lauryl sulfate (MLS), dodecylbenzenesulfonic acid (DBSA), or the like.

Each of the sequestering agent and the metal corrosion inhibitor may help protect a metal layer, which, together with silicon nitride, is exposed to the etchant composition, while the silicon nitride is etched by using the etchant composition. In an implementation, the sequestering agent may include, e.g., ethylenediamine tetraacetic acid (EDTA), and the metal corrosion inhibitor may include triazole, imidazole, a thiol compound, or the like.

Use of the etchant composition for silicon nitride, according to an embodiment, facilitates etching and removal of silicon nitride at a high rate while providing an excellent etch selectivity even at a high temperature.

FIG. 1 illustrates a flowchart of a method of fabricating a semiconductor device, according to embodiments. Hereinafter, the method of fabricating a semiconductor device, which is shown in FIG. 1, will be briefly described.

Referring to FIG. 1, a silicon oxide layer and a silicon nitride layer may be formed on a substrate (S110). For example, the silicon oxide layer and the silicon nitride layer may be alternately stacked a plurality of times on the substrate. In an implementation, the silicon oxide layer and the silicon nitride layer may have the same thickness or may have different thicknesses.

Next, a channel region may be formed, the channel region penetrating a plurality of silicon oxide layers and a plurality of silicon nitride layers, which are alternately stacked (S120). The channel region may be surrounded by a gate dielectric layer. In an implementation, the gate dielectric layer may also penetrate the plurality of silicon oxide layers and the plurality of silicon nitride layers, which are alternately stacked.

Next, a cut region may be formed to expose the plurality of silicon oxide layers and the plurality of silicon nitride layers, which are alternately stacked (S130). The cut region may be formed by partially removing the plurality of silicon oxide layers and the plurality of silicon nitride layers, which are alternately stacked. The cut region may have a sidewall at which the alternately stacked silicon oxide and silicon nitride layers are exposed.

Next, the silicon nitride layers, which are exposed by the cut region, may be removed by wet etching (S140). When the silicon nitride layers are removed, the silicon oxide layers may remain rather than be etched. To etch the silicon nitride layers while having a high etch selectivity with respect to the silicon oxide layers, the etchant composition, which has been described above, may be used. This will be described below in more detail.

Next, the silicon oxide layers remaining after the etching may be dried by using a supercritical fluid (S150). For example, use of a $CO_2$ supercritical fluid may allow the silicon oxide layers to be dried without damage thereto.

Figure 2:
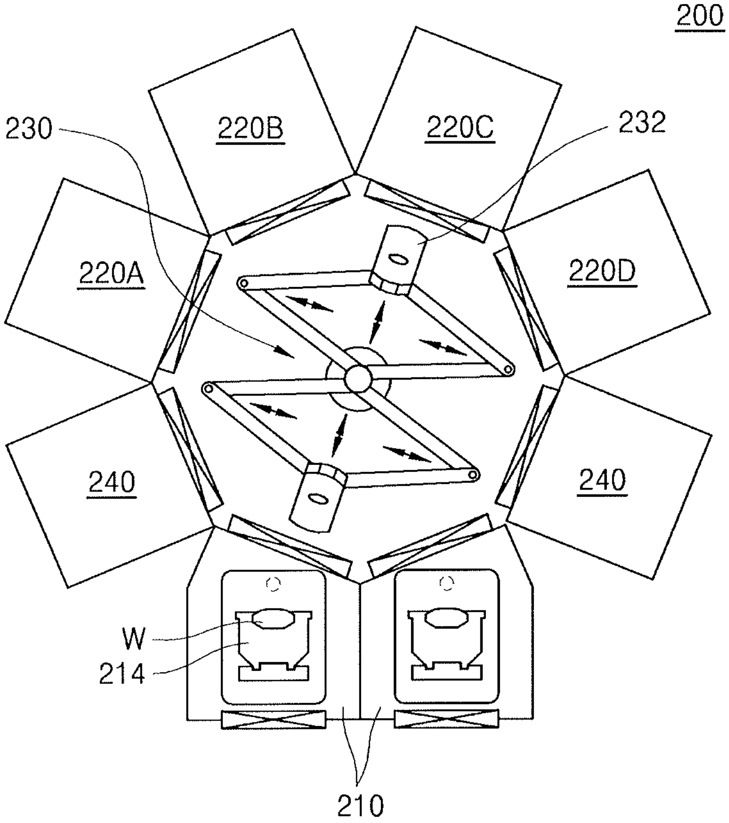
FIG. 2 illustrates a schematic plan view of main components of an example apparatus for fabricating a semiconductor device, the example apparatus being able to be used to perform a method of fabricating a semiconductor device, according to embodiments.

FIG. 2 illustrates a schematic plan view of main components of an example apparatus 200 for fabricating a semiconductor device, the example apparatus 200 being able to be used to perform the method of fabricating a semiconductor device, according to embodiments.

Referring to FIG. 2, the apparatus 200 for fabricating a semiconductor device may include, e.g., a plurality of load lock chambers 210, each capable of accommodating a cassette 214 in which a plurality of substrates W are loaded; a plurality of process chambers 220A, 220B, 220C, and 220D, each capable of performing a certain semiconductor device fabrication process on the substrates W; and a transfer chamber 230.

The transfer chamber 230 may include a robot arm 232 transferring the substrates W and may communicate with the plurality of process chambers 220A, 220B, 220C, and 220D and the plurality of load lock chambers 210. The apparatus 200 for fabricating a semiconductor device may further include alignment chambers 240, each aligning the substrates W, on which a certain semiconductor device fabrication process is to be performed, in one direction.

The apparatus 200 for fabricating a semiconductor device may include a cluster tool, in which the transfer chamber 230 is centrally located and the load lock chambers 210, the process chambers 220A, 220B, 220C, and 220D, and the alignment chambers 240 are arranged around the transfer chamber 230 and connected to the transfer chamber 230.

In an implementation, the process chambers 220A, 220B, 220C, and 220D may include a deposition chamber capable of depositing a material on each substrate W, a dry etching chamber capable of anisotropically etching a material layer, a wet etching chamber capable of isotropically etching a material layer, a drying chamber capable of performing drying after wet etching, and the like.

Figure 3:
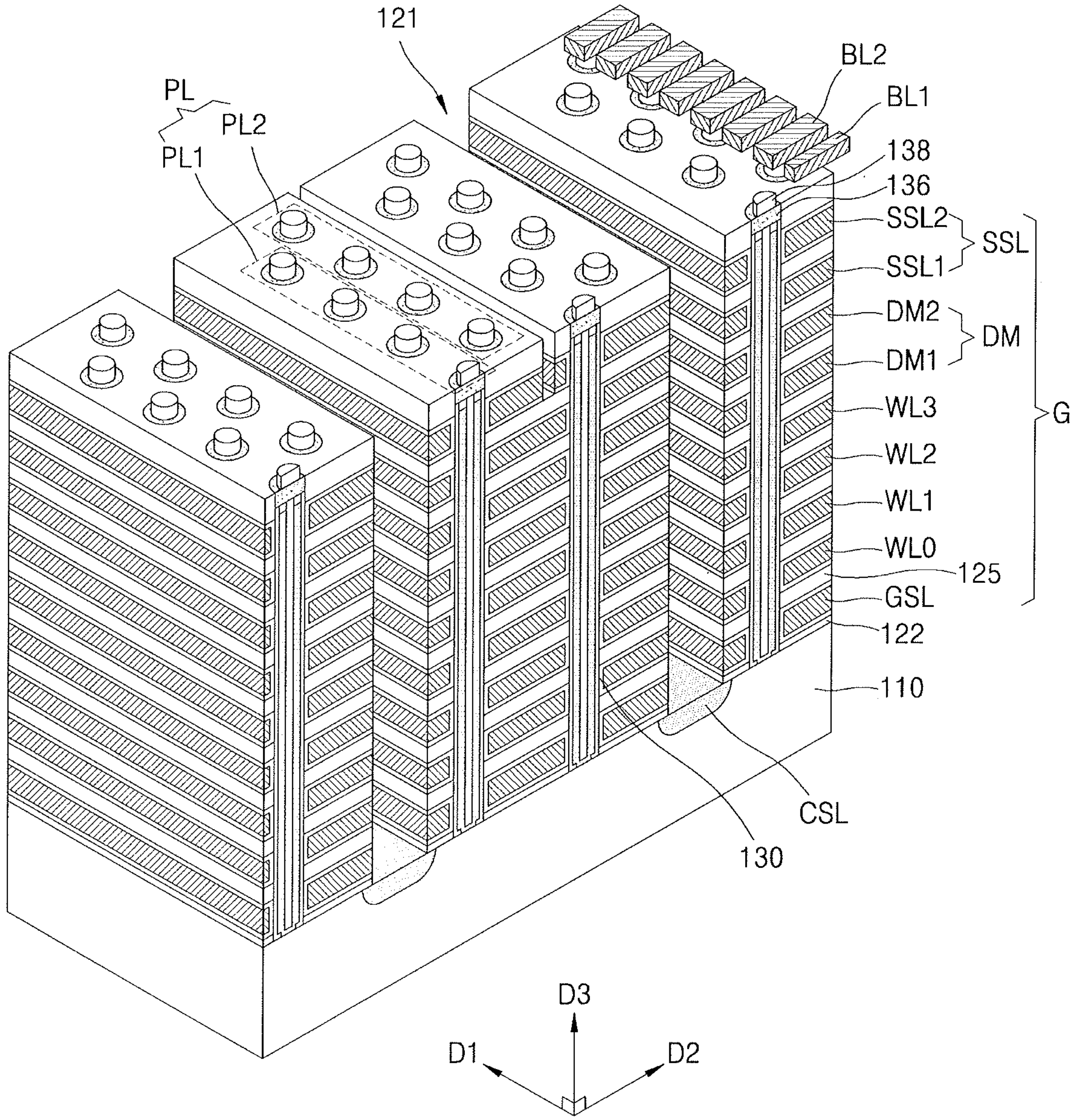
FIG. 3 illustrates a perspective view of a cell array of a semiconductor device fabricated according to embodiments.

FIG. 3 illustrates a perspective view of a cell array of a semiconductor device fabricated according to embodiments.

Referring to FIG. 3, a substrate 110 may be provided. The substrate 110 may be of a first conductivity type, e.g., a p-type conductivity. A buffer dielectric layer 122 may be arranged on the substrate 110. The buffer dielectric layer 122 may include a silicon oxide layer such as middle-temperature oxide (MTO). Insulating patterns 125 and horizontal electrodes, which are spaced apart from each other with each insulating pattern 125 therebetween, may be arranged on the buffer dielectric layer 122.

The horizontal electrodes may include a ground select line GSL, first to fourth word lines WL0 to WL3, and a string select line SSL. Each of the insulating patterns 125 may include a silicon oxide layer. The buffer dielectric layer 122 may be thinner than each of the insulating patterns 125. Each of the horizontal electrodes may include doped silicon, a metal (e.g., tungsten), a metal nitride (e.g., titanium nitride), a metal silicide, or a combination thereof. Each of the horizontal electrodes may include, e.g., a barrier layer and a metal layer on the barrier layer. The barrier layer may include a metal nitride, e.g., titanium nitride. The metal layer may include, e.g., tungsten.

The insulating patterns 125 and the horizontal electrodes may constitute a gate structure G. The gate structure G may horizontally extend in a first direction D1. A plurality of gate structures G may be arranged on the substrate 110. The gate structures G may face each other in a second direction D2 intersecting with the first direction D1. String select lines SSL may be separated from each other in the second direction D2 and may extend in the first direction D1. In an implementation, as illustrated in FIG. 3, one gate structure G may include, e.g., a plurality of string select lines SSL1 and SSL2 and one ground select line GSL.

Between the gate structures G, cut regions 121, each extending in the first direction D1, may be arranged. Common source lines CSL may be respectively arranged in the substrate 110 in the cut regions 121. The common source lines CSL may be spaced apart from each other and extend, within the substrate 110, in the first direction D1. Each of the common source lines CSL may be of a second conductivity type (e.g., an n-type conductivity) that is different from the first conductivity type. In an implementation, each common source line CSL may have a line-shaped pattern arranged within the substrate 110 between two adjacent ground select lines GSL and extending in the first direction D1.

A plurality of cell pillars PL may be connected to the substrate 110 through the horizontal electrodes (that is, GSL, WL0 to WL3, and SSL). Each of the cell pillars PL may have a long axis extending upwards in a vertical direction (that is, extending in a third direction D3) from the substrate 110. One end of each cell pillar PL may be connected to the substrate 110 and the other end thereof may be connected to each wiring line extending in the second direction D2. The wiring lines may include first wiring lines BL1 and second wiring lines BL2, each of the first wiring lines BL1 and each of the second wiring lines BL2 being adjacent to each other and extending in the second direction D2.

The plurality of cell pillars PL combined with one string select line SSL may be arranged in a zig-zag shape or a staggered shape. The plurality of cell pillars PL may include first cell pillars PL1 and second cell pillars PL2, which are combined with one identical string select line SSL. The first cell pillars PL1 may be most adjacent to a cut region 121, and the second cell pillars PL2 may be further apart from the cut region 121. The second cell pillars PL2 may be shifted from the first cell pillars PL1 in the first direction D1 and the second direction D2. Via a conductive pattern 136 and a contact 138, a first cell pillar PL1 and a second cell pillar PL2 may be respectively connected to a first wiring line BL1 and a second wiring line BL2.

A plurality of cell strings may be between the wiring lines (e.g., BL1 and BL2) and the common source lines CSL. The wiring lines BL1 and BL2 may be bit lines of a flash memory device. One cell string may include a string select transistor connected to each of the wiring lines BL1 and BL2, a ground select transistor connected to each common source line CSL, and a plurality of vertical memory cells between the string select transistor and the ground select transistor. The ground select line GSL may correspond to a ground select gate of the ground select transistor, the word lines WL0 to WL3 may respectively correspond to cell gates of the plurality of vertical memory cells, and the string select line SSL may correspond to a string select gate of the string select transistor. A plurality of memory cells may be provided to one cell pillar PL. The ground select gate may be a ground select gate of a flash memory device. The string select gate may be a string select gate of a flash memory device.

An information storage element 130 may be arranged between the word lines WL0 to WL3 and the cell pillars PL. The information storage element 130 may include a charge storage layer. For example, the information storage element 130 may include one of a trap insulating layer, a floating gate electrode, and an insulating layer including conductive nano-dots.

In an implementation, as illustrated in FIG. 3, the information storage element 130 may extend between the insulating patterns 125 and the word lines WL0 to WL3. In an implementation, at least a portion of the information storage element 130 may extend between the insulating patterns 125 and the cell pillars PL. A gate insulating layer, instead of the information storage element 130, may be arranged between the string and ground select lines SSL and GSL and the cell pillars PL.

A dielectric layer used as the gate insulating layer may be arranged between the ground select lines GSL and the cell pillars PL or between the string select lines SSL1 and SSL2 and the cell pillars PL. Here, the dielectric layer may include the same material as the information storage element 130 or may include a gate insulating layer (e.g., a silicon oxide layer) for a general metal-oxide-semiconductor field effect transistor (MOSFET).

In such a structure, the cell pillars PL, together with the ground select lines GSL, the word lines WL0 to WL3, and the string select lines SSL1 and SSL2, may constitute MOSFETs that use the cell pillars PL as channel regions. In an implementation, the cell pillars PL, together with the ground select lines GSL, the word lines WL0 to WL3, and the string select lines SSL1 and SSL2, may constitute MOS capacitors.

The ground select lines GSL and the string select lines SSL1 and SSL2 may be respectively used as gate electrodes of select transistors, and the word lines WL0 to WL3 may be respectively used as gate electrodes of cell transistors. In an implementation, inversion regions may be formed in the cell pillars PL due to fringe fields from voltages applied to the ground select lines GSL, the word lines WL0 to WL3, and the string select lines SSL1 and SSL2. Here, a maximum distance (or width) of an inversion region may be greater than the thickness of each of the word lines or select lines, which generate the inversion regions. Thus, the inversion regions formed in each of the cell pillars PL may vertically overlap each other and thus form a current path electrically connecting a common source line CSL to a selected bit line. For example, a cell string may have a structure in which ground and string transistors and memory cell transistors are connected in series, the ground and string transistors including the ground and string select lines GSL, SSL1, and SSL2, and the memory cell transistors including the word lines WL0 to WL3.

In an implementation, dummy word lines DM1 and DM2 may be arranged between the string select lines SSL1 and SSL2 as a whole and the word lines WL0 to WL3 as a whole. The dummy word lines DM1 and DM2 may help prevent a reduction in cell current by maintaining uniform dispersion of threshold voltages in the string select lines SSL1 and SSL2.

FIGS. 4A to 4H illustrate side cross-sectional views of stages in a method of fabricating a semiconductor device, according to an embodiment.

Figure 4A:
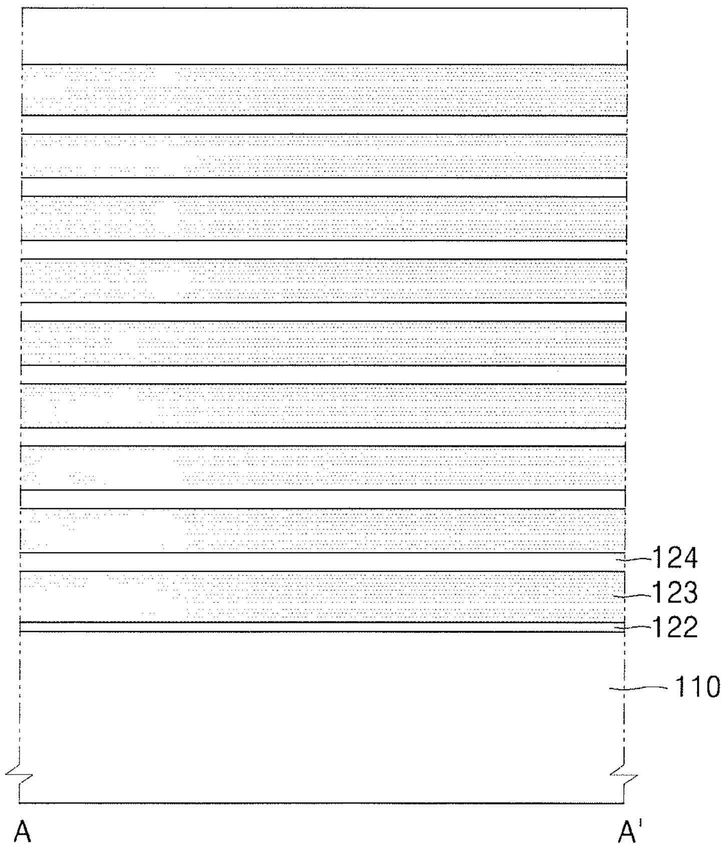
FIGS. 4A to 4H illustrate side cross-sectional views of stages in a method of fabricating a semiconductor device, according to an embodiment.

Referring to FIG. 4A, the substrate 110 may be provided. The substrate 110 may include Si, Ge, or SiGe. In an implementation, the substrate 110 may include a silicon-on-insulator (SOI) substrate or a germanium-on-insulator (GeOI) substrate. The substrate 110 may be of a first conductivity type, e.g., a p-type conductivity.

The buffer dielectric layer 122 may be formed on the substrate 110. The buffer dielectric layer 122 may include, e.g., a silicon oxide layer. The buffer dielectric layer 122 may be formed by, e.g., a thermal oxidation process. In an implementation, the buffer dielectric layer 122 may include MTO.

A sacrificial layer 123 (for subsequently forming the ground select line GSL) may be arranged on the buffer dielectric layer 122. The sacrificial layer 123 may include a material having different wet etching properties from the buffer dielectric layer 122 and insulating layers 124. The sacrificial layer 123 may include, e.g., a silicon nitride layer, e.g., $Si_3N_4$, SiON, SiCN, SiOCN, or a combination thereof.

Sacrificial layers 123 and the insulating layers 124 may be alternately stacked on the buffer dielectric layer 122. The thickness of an uppermost insulating layer may be greater than respective thicknesses of the other insulating layers. Each of the insulating layers 124 may include, e.g., a silicon oxide layer. In an implementation, the silicon oxide layer may include, e.g., spin-on-dielectric (SOD) oxide, high density plasma (HDP) oxide, thermal oxide, borophosphosilicate glass (BPSG), phosphosilicate glass (PSG), borosilicate glass (BSG), fluorinated silicate glass (FSG), low pressure tetraethylorthosilicate (LP-TEOS), plasma enhanced tetraethylorthosilicate (PE-TEOS), high temperature oxide (HTO), medium temperature oxide (MTO), undoped silicate glass (USG), spin on glass (SOG), atomic layer deposition (ALD) oxide, plasma enhanced (PE) oxide, $O_3$-TEOS, or a combination thereof.

The sacrificial layers 123 and the insulating layers 124 may be formed by, e.g., an ALD method, a chemical vapor deposition (CVD) method, or the like. In an implementation, the sacrificial layers 123 and the insulating layers 124 may be formed in the deposition chamber among the plurality of process chambers 220A, 220B, 220C, and 220D in FIG. 2.

In an implementation, a structure, in which the sacrificial layers 123 and the insulating layers 124 are stacked, may include at least 24 pairs of silicon oxide layers and silicon nitride layers. In an implementation, the structure may include various numbers of pairs of silicon oxide layers and silicon nitride layers, such as 24, 32, 48, 64, 72, 96, 108, 128, or 256 pairs of silicon oxide layers and silicon nitride layers, as desired. A plurality of silicon nitride layers constituting the sacrificial layers 123 and a plurality of silicon oxide layers constituting the insulating layers 124 may be stacked to extend parallel to an extension direction of a main surface of the substrate 110.

Figure 4B:
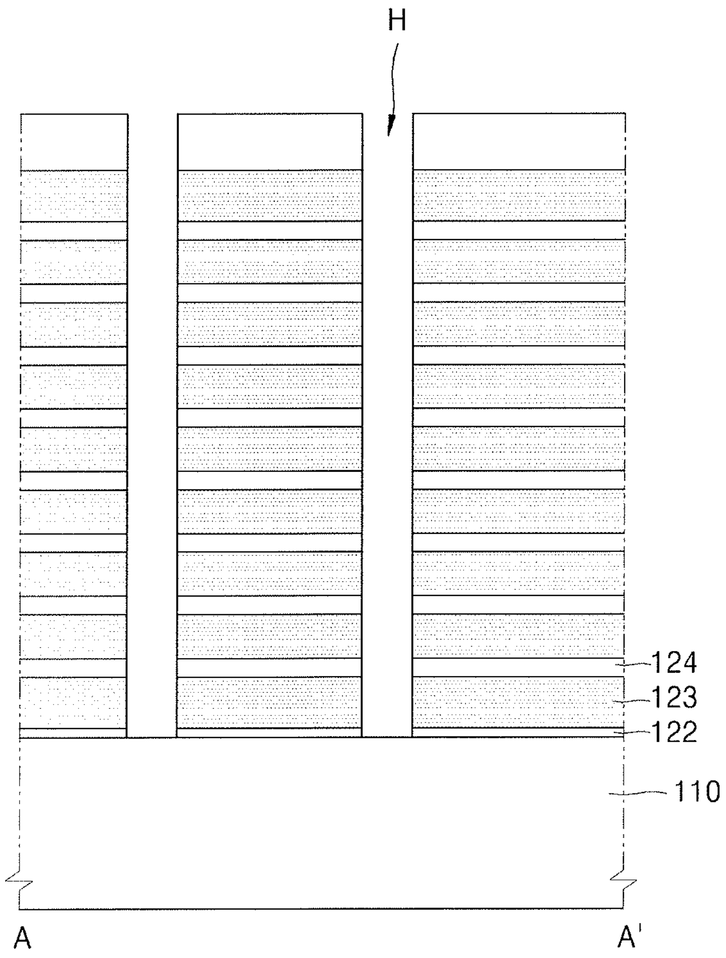

Referring to FIG. 4B, cell holes H may be formed through the buffer dielectric layer 122, the sacrificial layers 123, and the insulating layers 124 to expose the substrate 110. The cell holes H may be formed by, e.g., a photolithography process. In an implementation, the cell holes H may be formed in the dry etching chamber among the plurality of process chambers 220A, 220B, 220C, and 220D in FIG. 2.

Figure 4C:
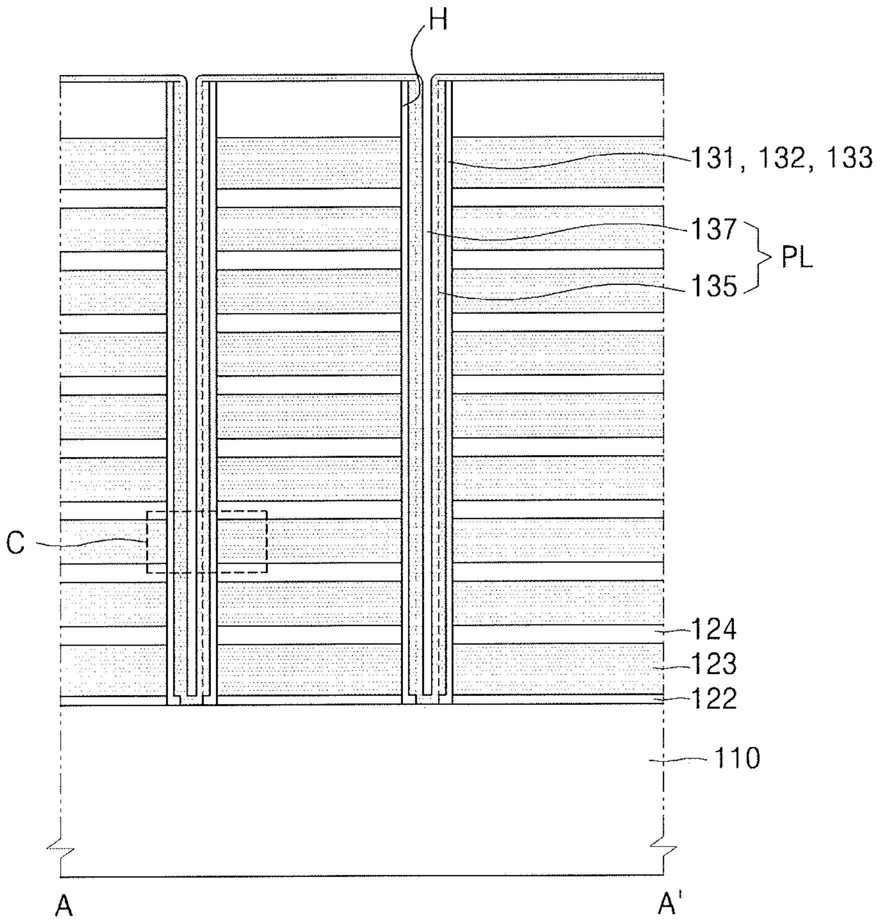
Figure 4D:
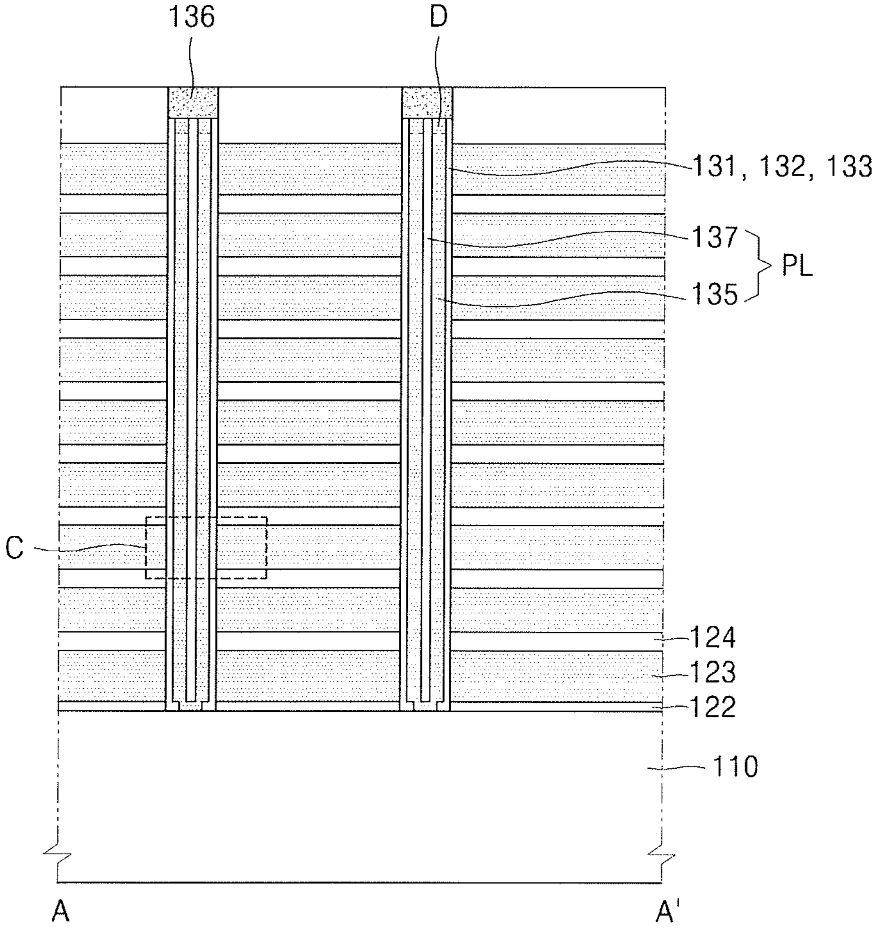

Referring to FIGS. 4C and 4D, the cell pillars PL may be respectively formed in the cell holes H. To describe a process of forming the cell pillars PL in more detail, a region C of FIG. 4C is illustrated in FIG. 5, and a region C of FIG. 4D is illustrated in FIG. 6.

Figure 5:
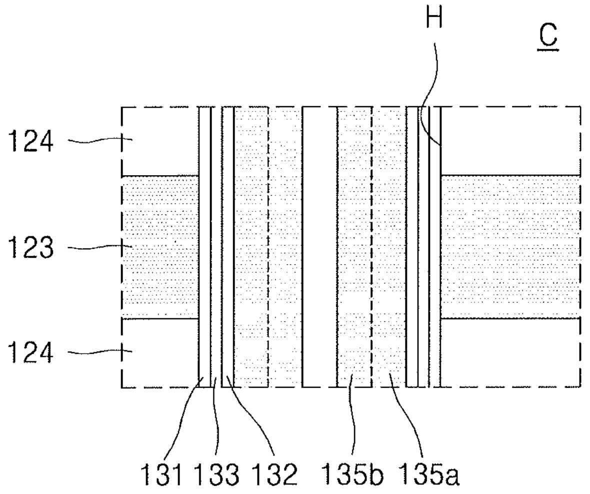
FIG. 5 illustrates a partial enlarged view of a region C of FIG. 4C in detail.

Referring to FIGS. 4C and 5, a protective layer 131 may be formed on a sidewall of each of the cell holes H. The protective layer 131 may include a silicon oxide layer. A charge storage layer 133 may be formed on the protective layer 131. The charge storage layer 133 may include a charge trap layer, or an insulating layer including conductive nano-particles. The charge trap layer may include, e.g., a silicon nitride layer. A tunnel insulating layer 132 may be formed on the charge storage layer 133. The tunnel insulating layer 132 may include a silicon oxide layer. The protective layer 131, the tunnel insulating layer 132, and the charge storage layer 133 may be formed by, e.g., an ALD or CVD method. In an implementation, the protective layer 131, the tunnel insulating layer 132, and the charge storage layer 133 may be formed in the deposition chamber among the plurality of process chambers 220A, 220B, 220C, and 220D in FIG. 2.

A first sub-semiconductor layer 135*a* may be formed on the tunnel insulating layer 132. The substrate 110 may be exposed by anisotropically etching the first sub-semiconductor layer 135*a*. The first sub-semiconductor layer 135*a* may be changed into a spacer layer remaining only on a sidewall of the tunnel insulating layer 132. A second sub-semiconductor layer 135*b* may be formed on the first sub-semiconductor layer 135*a*. The second sub-semiconductor layer 135*b* may contact, e.g., directly contact, the substrate 110. The first and second sub-semiconductor layers 135*a* and 135*b* may be formed by, e.g., an ALD or CVD method. Each of the first and second sub-semiconductor layers 135*a* and 135*b* may include an amorphous silicon layer. In an implementation, the first and second sub-semiconductor layers 135*a* and 135*b* may be formed in the deposition chamber among the plurality of process chambers 220A, 220B, 220C, and 220D in FIG. 2.

Figure 6:
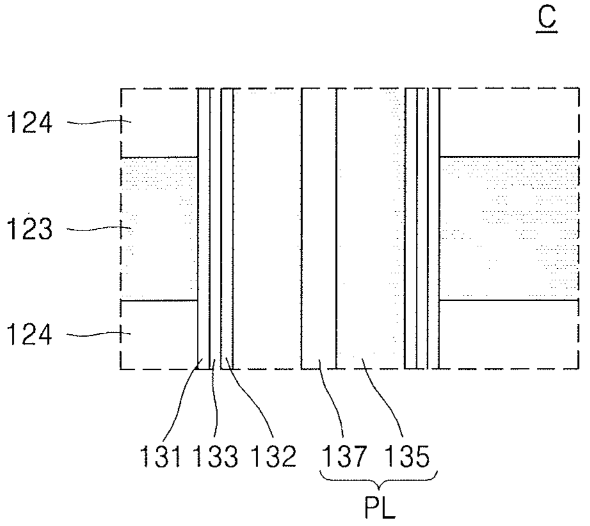
FIG. 6 illustrates a partial enlarged view of a region C of FIG. 4D in detail.

Referring to FIGS. 4D and 6, the first and second sub-semiconductor layers 135*a* and 135*b* may be changed into a semiconductor layer 135 by performing a heat treatment process. The semiconductor layer 135 may include a polysilicon layer or a crystalline silicon layer. The semiconductor layer 135 may act as a channel region of the semiconductor device.

The semiconductor layer 135 may be formed to not completely fill each of the cell holes H, and an insulating material may be formed on the semiconductor layer 135 and thus completely fill each of the cell holes H. The semiconductor layer 135 and the insulating material may be planarized, thereby exposing the uppermost insulating layer. Thus, cylindrical semiconductor pillars PL, in which an empty inner space thereof is filled with a filling insulating layer 137, may be formed. Each of the semiconductor pillars PL may include a semiconductor layer of the first conductivity type. In an implementation, the semiconductor layer may be formed to fill each of the cell holes H. In this case, a filling insulating layer may not be needed.

An upper portion of each cell pillar PL may be recessed, whereby a top surface of each cell pillar PL may be lower than a top surface of the uppermost insulating layer. Conductive patterns 136 may be respectively formed in the cell holes H having the recessed cell pillars PL. Each of the conductive patterns 136 may include doped polysilicon or a metal. Drain regions D may be formed by implanting impurity ions of the second conductivity type into the conductive patterns 136 and upper portions of the cell pillars PL. The second conductivity type may be, e.g., n-type.

Figure 4E:
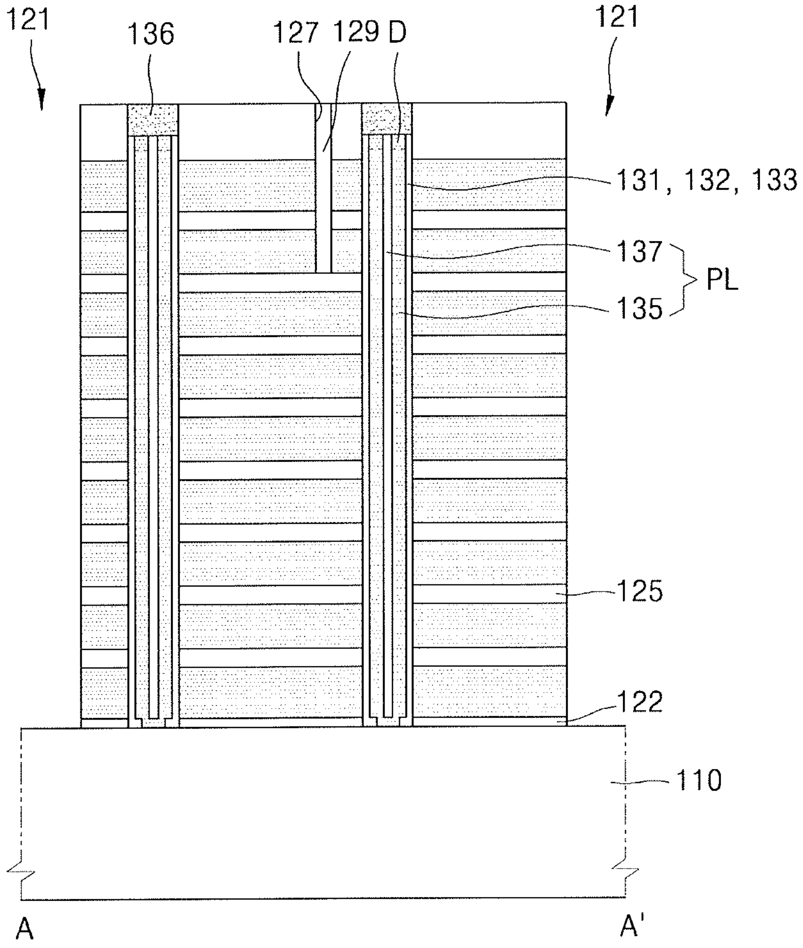

Referring to FIG. 4E, the buffer dielectric layer 122, the sacrificial layers 123, and the insulating layers 124 may be consecutively patterned, thereby forming cut regions 121, which are spaced apart from each other, extend in the first direction, and expose the substrate 110. Each of the cut regions 121 may be formed in a line shape extending along a surface perpendicular to the main surface of the substrate 110. The patterned insulating layers 124 respectively become the insulating patterns 125. As a result, the insulating layers at positions, at which the ground select lines GSL are formed afterwards, may be separated from each other. In an implementation, the patterning of the buffer dielectric layer 122, the sacrificial layers 123, and the insulating layers 124 may be performed in the dry etching chamber among the plurality of process chambers 220A, 220B, 220C, and 220D in FIG. 2.

The cut regions 121 may be formed to cut all the sacrificial layers 123 and the insulating layers 124, which are stacked. In an implementation, when 24, 32, 48, 64, 72, 96, 108, 128, or 256 pairs of sacrificial layers 123 and insulating layers 124 are stacked, the cut regions 121 may be formed through the 24, 32, 48, 64, 72, 96, 108, 128, or 256 pairs of sacrificial layers 123 and insulating layers 124, which are stacked.

Before forming the cut regions 121, an opening 127 may be formed by patterning the uppermost insulating layer and the uppermost sacrificial layer between the cut regions 121. The opening 127 may extend in the first direction D1 between the cut regions 121 to divide the uppermost sacrificial layer into two portions. An insulating layer 129 (e.g., a silicon oxide layer) may fill the opening 127.

Figure 4F:
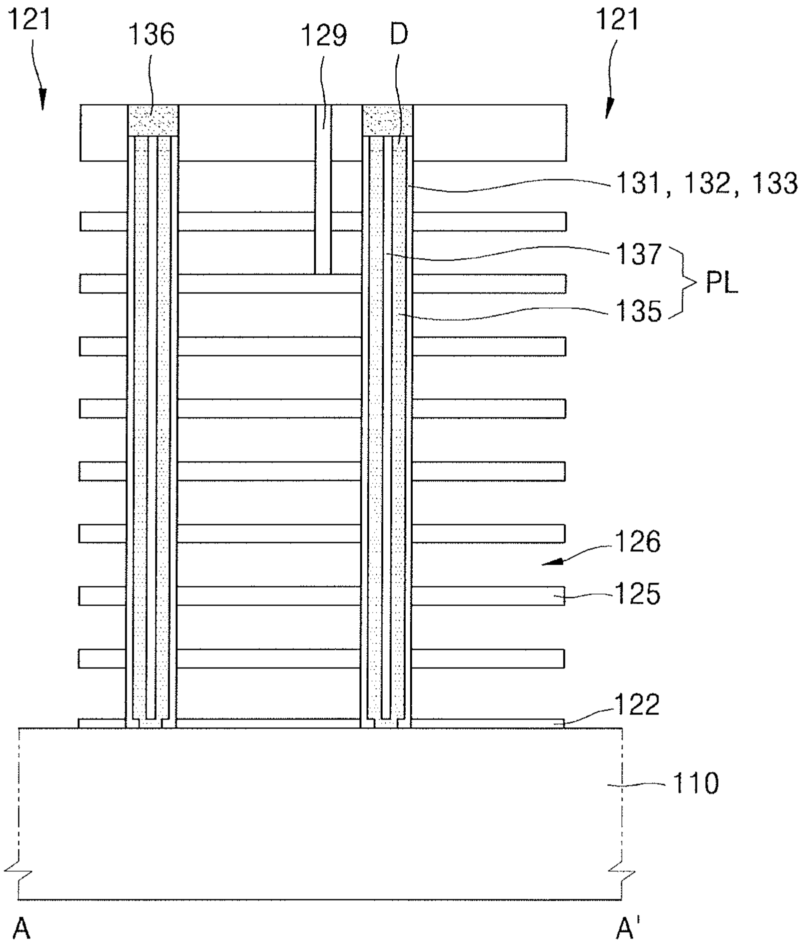

Referring to FIG. 4F, a recess region 126 may be formed by selectively removing the sacrificial layers 123 exposed by the cut regions 121. The recess region 126 may correspond to a region from which the sacrificial layers 123 are removed, and the recess region 126 may be defined by the cell pillars PL and the insulating patterns 125. A process of removing the sacrificial layers 123 may be performed by using the etchant composition described above. Portions of a sidewall of each of the cell pillars PL may be exposed by the recess region 126.

To selectively remove the sacrificial layers 123, the sacrificial layers 123 may be etched at a temperature of, e.g., about 200° C. to about 300° C. In an implementation, the sacrificial layers 123 may be etched at a temperature of, e.g., about 230° C. to about 250° C. If the temperature for etching is too low, a removal rate of the sacrificial layers 123 may be too low. If the temperature for etching is too high, the etchant composition may be thermally decomposed or a lot of side reactions are caused, and thus, an intended etching reaction may not occur.

In an implementation, the etching of the sacrificial layers 123 may be performed in a single-type etching chamber rather than in a batch-type etching chamber. For example, at least one of the plurality of process chambers 220A, 220B, 220C, and 220D may be a single-type etching chamber.

An increase in capacities of semiconductor devices may be desirable, and the sacrificial layers 123 and the insulating layers 124 may stacked in a large number of pairs, such as 64, 72, 96, 108, 128, or 256 pairs. There may be a difficulty in performing a process in a batch-type etching apparatus due to an increase in the number of stacked layers, a limit of material transfer, and the like.

To selectively remove the sacrificial layers 123, which are silicon nitride layers, the etchant composition may be brought into simultaneous contact with the insulating patterns 125 and the sacrificial layers 123. In some embodiments, to bring the etchant composition into contact with the insulating patterns 125 and the sacrificial layers 123, the substrate 110, on which a structure including the insulating patterns 125 and the sacrificial layers 123 is formed, may be dipped into the etchant composition. In an implementation, to bring the etchant composition into contact with the structure, the etchant composition may be applied onto the substrate 110 including the structure by a method of, e.g., spray or spin coating.

According to the method of fabricating a semiconductor device, when silicon nitride layers (e.g., the sacrificial layers 123) and silicon oxide layers (e.g., the insulating patterns 125) are alternately stacked in a large number of pairs, such as 64, 72, 96, 108, 128, or 256 pairs, or are stacked in mixed layers on a substrate, only the silicon nitride layers may be selectively etched with a relatively high etch selectivity by using the etchant composition according to embodiments such that an etch selectivity of the silicon nitride layers relative to the silicon oxide layers is, e.g., about 200:1 to about 600:1, about 300:1 to about 600:1, about 400:1 to about 600:1, or about 500:1 to about 600:1. Maintaining such a high etch selectivity even at a relatively high temperature may be because the colloidal silica having several hydroxyl groups is relatively strongly bonded to exposed surfaces of the silicon oxide layers, as described above.

In addition, as the silicon nitride layers are etched by using the etchant composition including amine, azole, or nitrate compounds, the stability and reliability of the etching process of the silicon nitride layers may be secured by preventing unneeded particle generation, unintended abnormal growth of by-products on surfaces of the silicon oxide layers, and the like, and the productivity of the semiconductor device fabrication process and the reliability of the semiconductor device may be improved by preventing the silicon oxide layers, which are, together with the silicon nitride layers, exposed to the etchant composition, from being damaged or having deteriorated electrical properties.

Next, an etchant and the like (e.g., etching by-products) remaining on surfaces of the insulating patterns 125, the cell pillars PL, and the like may be dried to be removed. To dry the etchant and the like, a supercritical fluid, e.g., a $CO_2$ supercritical fluid, may be used. The structure, which includes the insulating patterns 125 stacked in a large number of layers, the cell pillars PL, and the like, may have a high aspect ratio and an extremely fine dimension, and the structure could be easily damaged even by slight capillary force due to the etchant that is a liquid. In an effort to help prevent such damage, drying may be performed by using a supercritical fluid. The supercritical fluid has no distinction between a liquid phase and a gas phase, and the supercritical fluid exhibits no capillary force due to a gas-liquid phase change and has an extremely low viscosity despite high diffusivility, and thus, damage to the structure may be prevented.

The protective layer 131 may help prevent the charge storage layer 133 from being damaged by an etching solution for removing the sacrificial layers 123. The protective layer 131 exposed by the recess region 126 may be selectively removed. When the protective layer 131 includes a silicon oxide layer, the protective layer 131 may be removed by, e.g., an etching solution including hydrofluoric acid. Thus, the recess region 126 may expose a portion of the charge storage layer 133.

Figure 4G:
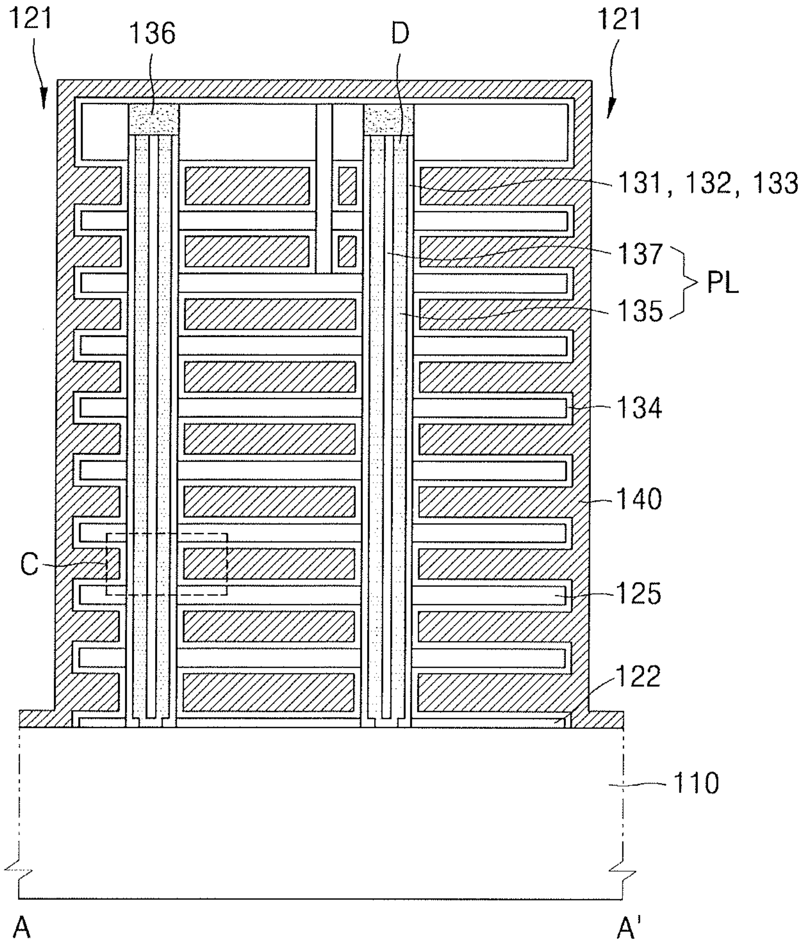

Referring to FIG. 4G, a blocking insulating layer 134 may be formed in the recess region 126. The blocking insulating layer 134 may be conformally formed on the charge storage layer 133 and on upper and lower surfaces of the insulating patterns 125 exposed by the recess region 126. The blocking insulating layer 134 may include a high-k dielectric layer (e.g., an aluminum oxide layer or a hafnium oxide layer). The blocking insulating layer 134 may include a multilayer including a plurality of thin layers. For example, the blocking insulating layer 134 may include aluminum oxide layers and silicon oxide layers, and the aluminum oxide layers and the silicon oxide layers may be stacked in various orders. The blocking insulating layer 134 may be formed by an ALD process, which exhibits excellent step coverage, and/or a CVD process.

Next, a conductive layer 140 may be formed on the blocking insulating layer 134. The conductive layer 140 may include, e.g., a metal layer, a metal nitride layer, or a metal silicide layer. The conductive layer 140 may be formed by a CVD or ALD method. In an implementation, the conductive layer 140 may include, e.g., tungsten (W), aluminum (Al), copper (Cu), titanium (Ti), tantalum (Ta), or platinum (Pt).

Figure 4H:
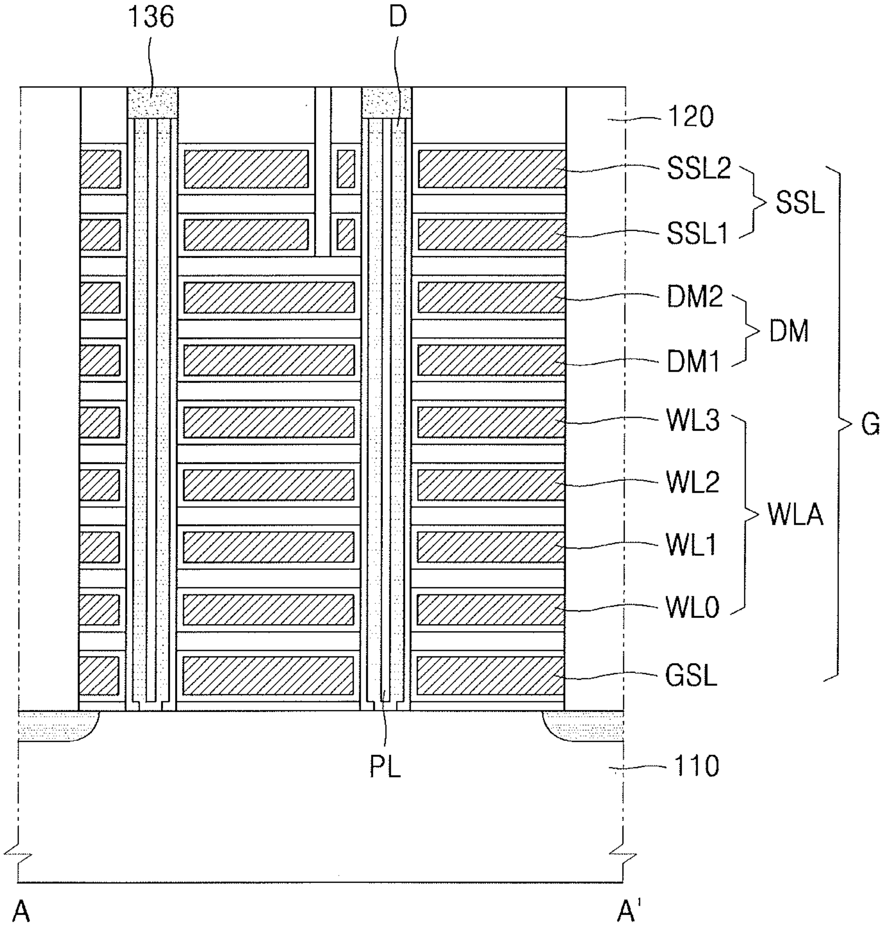

Referring to FIG. 4H, a portion of the conductive layer 140, which is formed outside the recess region 126, may be removed. Thus, horizontal layers may be formed in the recess region 126. The horizontal layers may include the ground select line GSL, the word lines WL0 to WL3, the dummy word lines DM1 and DM2, and the string select lines SSL1 and SSL2. The string select lines SSL1 and SSL2 may be separated into two portions, and these two portions extend in the first direction D1.

The conductive layer 140 formed in the cut regions 121 may be removed, and thus, the substrate 110 may be exposed. The common source lines CSL may be formed by providing impurity ions of the second conductivity type into the exposed substrate 110 at a high concentration.

An isolation insulating layer 120 may be formed to fill the cut regions 121. The cell pillars PL aligned in the second direction D2 may be connected to one upper wiring line BL1 or BL2 in common.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Etchant compositions of the Examples and etchant compositions of the Comparative Examples were prepared according to various compositions and then evaluated regarding an etch selectivity between a silicon nitride layer and a silicon oxide layer. Results are shown in Table 1.

TABLE 1

| | Inorganic acid (parts by weight) | Silicon compound (parts by weight) | Ammonium-based additive (parts by weight) | Deionized water (parts by weight) | pH | Temperature (° C.) | SiN etch rate (Å/min) | Etch selectivity |
|---|---|---|---|---|---|---|---|---|
| Example 1 | Phosphoric acid 100 | Colloidal silica 0.1 | Ammonium hydroxide 5 | 17.6 | 0.6 | 230 | 69.4 | 428/1 |
| Example 2 | Phosphoric acid 100 | Colloidal silica 0.2 | Ammonium hydroxide 5 | 17.6 | 0.6 | 230 | 68.2 | 497/1 |
| Example 3 | Phosphoric acid 100 | Colloidal silica 0.5 | Ammonium hydroxide 5 | 17.6 | 0.6 | 230 | 69.9 | 536/1 |
| Example 4 | Phosphoric acid 100 | Colloidal silica 0.05 | Ammonium hydroxide 5 | 17.6 | 0.5 | 230 | 73.6 | 311/1 |
| Comparative Example 1 | Phosphoric acid 100 | — | — | 17.6 | 0.4 | 230 | 75.3 | 14/1 |
| Comparative Example 2 | Phosphoric acid 100 | $Si(OH)_4$ 0.2 | Ammonium hydroxide 5 | 17.6 | 0.6 | 230 | 70.9 | 146/1 |
| Comparative Example 3 | Phosphoric acid 100 | $Si(OH)_4$ 0.23 | Ammonium hydroxide 5 | 17.6 | 0.6 | 165 | 11.1 | 592/1 |

As shown in Table 1, an aqueous phosphoric acid solution (85 wt %) was prepared in Comparative Example 1, and an etchant composition including 0.2 parts by weight of $Si(OH)_4$ based on 100 parts by weight of phosphoric acid and an etchant composition including 0.23 parts by weight of $Si(OH)_4$ based on 100 parts by weight of phosphoric acid were respectively prepared in Comparative Examples 2 and 3. Etchant compositions according to the embodiments were respectively prepared in Examples 1 to 4.

A test structure, in which a plurality of TEOS layers and a plurality of $Si_3N_4$ layers were alternately stacked one by one, was formed on a silicon substrate, and a cut region was formed through the test structure. Next, the test structure including the cut region was dipped into each of the etchant compositions of Examples 1 to 4 and Comparative Examples 1 to 3, which were heated to 230° C., thereby measuring the etch rate of the silicon nitride layer and the etch selectivity of the silicon nitride layer relative to the silicon oxide layer.

As shown in Table 1, although exhibiting a relatively high etch rate of silicon nitride, the aqueous phosphoric acid solution (Comparative Example 1) had an extremely poor etch selectivity of silicon nitride relative to silicon oxide. In addition, although having somewhat improvement in etch selectivity, the etchant composition of Comparative Example 2, to which $Si(OH)_4$ was further added, still had an insufficient etch selectivity.

All of the etchant compositions according to Examples 1 to 4 exhibited excellent etch selectivity even at 230° C. and had high etch rates of silicon nitride of about 70 Å per minute.

In addition, the etchant composition of Comparative Example 3, which had a similar composition to the etchant composition of Comparative Example 2, underwent an etching test at a relatively low temperature of 165° C. As a result, the etchant composition of Comparative Example 3 had an extremely poor etch rate despite a good etch selectivity.

By way of summation and review, if a single-type etching apparatus is simply used, only one substrate is processed at a time, and there may be a significant drawback in economic efficiency due to significantly reduced throughput. To maintain throughput even in the case of using a single-type etching apparatus, if an etch temperature is increased while using other etchant compositions, an etch selectivity between silicon nitride and silicon oxide may be deteriorated and defaults of products could occur.

Use of the etchant composition according to an embodiment may allow excellent etch selectivity to be maintained even while providing a high etch rate at an increased etch temperature, e.g., a temperature of about 200° C. to about 300° C. or about 230° C. to about 250° C. Therefore, by using the etchant composition according to an embodiment, a semiconductor device including a stack structure having a large number of layers, e.g., a highly integrated circuit device such as a memory semiconductor device may be stably fabricated.

One or more embodiments may provide an etchant composition, which may etch and thus remove silicon nitride at a high rate while having excellent etch selectivity even at high temperatures.

One or more embodiments may provide a method of fabricating a semiconductor device or an integrated circuit device, the method facilitating the semiconductor device or the integrated circuit device to be stably mass-produced from a stack in which a large number of layers of silicon oxide and silicon nitride are stacked.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An etchant composition, comprising:

an inorganic acid;

about 0.01 parts by weight to about 0.5 parts by weight of colloidal silica;

about 0.01 parts by weight to about 30 parts by weight of an ammonium additive; and about 20 parts by weight to about 50 parts by weight of a solvent, all parts by weight being based on 100 parts by weight of the inorganic acid, wherein the colloidal silica has a structure represented by Chemical Formula 1, the structure being formed under acidic conditions at a pH of 1 or less and a temperature of 200° C. or higher:

[Chemical Formula 1]

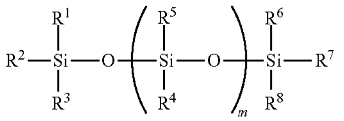

wherein, in Chemical Formula 1, m is an integer of 2 to 8, and $R^1$, $R^2$, $R^3$, $R^4$, $R^5$, $R^6$, $R^7$, and $R^8$ are each independently a hydrogen atom, a hydroxyl group, or a group represented by Chemical Formula 2, at least one of $R^1$, $R^2$, $R^3$, $R^4$, $R^5$, $R^6$, $R^7$, and $R^8$ being a hydroxyl group or a group represented by Chemical Formula 2,

[Chemical Formula 2]

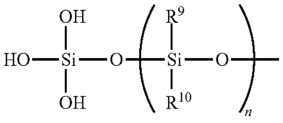

wherein, in Chemical Formula 2, n is an integer of 0 to 5, and $R^9$ and $R^{10}$ are each independently a hydrogen atom, a hydroxyl group, a C1 to C20 alkyl group, a C2 to C20 alkenyl group, a C2 to C20 alkynyl group, a C1 to C20 hydroxyalkyl group, a C1 to C20 aminoalkyl group, a C1 to C20 alkoxy group, a C1 to C20 aminoalkoxy group, a nitrile group, or a carboxyl group, and wherein the etchant composition has a pH of 1 or less and a temperature of 200° C. or higher.

2. The etchant composition as claimed in claim 1, wherein the inorganic acid includes phosphoric acid, sulfuric acid, nitric acid, silicic acid, hydrofluoric acid, boric acid, hydrochloric acid, perchloric acid, or a mixture thereof.

3. The etchant composition as claimed in claim 2, wherein the inorganic acid includes phosphoric acid.

4. The etchant composition as claimed in claim 1, wherein the ammonium additive includes ammonium hydroxide, ammonium chloride, ammonium acetate, ammonium phosphate, ammonium peroxydisulfate, ammonium sulfate, ammonium hydrofluoric acid salt, ammonia, or a combination thereof.

5. The etchant composition as claimed in claim 1, wherein the solvent includes deionized water.

6. The etchant composition as claimed in claim 1, further comprising about 0.01 parts by weight to about 10 parts by weight an amine compound, an azole compound, or a nitrate compound, based on 100 parts by weight of the inorganic acid.

7. The etchant composition as claimed in claim 6, wherein:

the amine compound includes methylamine, dimethylamine, trimethylamine, ethylamine, diethylamine, triethylamine, methylethylamine, propylamine, isopropylamine, 2-aminopentane, methylethanolamine, triphenylamine, naphthylamine, anthracenylamine, 9-methyl-anthracenylamine, diphenylamine, ditolylamine, N-phenyltolylamine, N-dimethylfluorenyltriphenyleneamine, N-triphenylenyldibenzofuranamine, N-triphenylenyldibenzothiopheneamine, N-phenyltriphenyleneamine, N-biphenyldimethylfluoreneamine, N-biphenyldibenzofuranamine, N-biphenyldibenzothiopheneamine, N-biphenylphenylcarbazoleamine, N-biphenyltriphenyleneamine, N-naphthyltriphenyleneamine, N-phenyldiphenylfluoreneamine, N-biphenylspirobifluoreneamine, N-phenylspirobifluoreneamine, N-naphthylspirobifluoreneamine, N-naphthyldiphenylfluoreneamine, N-phenyldimethylfluoreneamine, N-naphthyldimethylfluoreneamine, N-phenyldibenzofuranamine, N-biphenyldiphenylfluoreneamine, N-phenylbiphenylamine, N-naphthyldibenzofuranamine, N-naphthylphenylcarbazoleamine, N-naphthyldibenzothiopheneamine, N-phenyldibenzothiopheneamine, N-phenylphenylcarbazoleamine, dinaphthylamine, or N-phenylnaphthaleneamine, the azole compound includes imidazole, pyrazole, 1,2,3-triazole, 1,2,4-triazole, tetrazole, pentazole, oxazole, isoxazole, 1,2,4-oxadiazole, 1,2,5-oxadiazole, 1,3,4-oxadiazole, thiazole, isothiazole, 1,2,3-thiadiazole, 1,2,4-thiadiazole, 1,2,5-thiadiazole, or 1,3,4-thiadiazole, and the nitrate compound includes dialkyl imidazolium nitrate, guanidine nitrate, ethyl nitrate, propyl nitrate, butyl nitrate, pentyl nitrate, octyl nitrate, glycol dinitrate, diethylene glycol dinitrate, pyridine nitrate, lithium nitrate, potassium nitrate, aluminum nitrate, cupric nitrate, ferric nitrate, zinc nitrate, cerous nitrate, cesium nitrate, barium nitrate, silver nitrate, or ammonium nitrate.

8. The etchant composition as claimed in claim 6, wherein the etchant composition comprises about 0.3 parts by weight to about 15 parts by weight of the ammonium additive.

9. The etchant composition of claim 1, wherein the etchant composition comprises 0.05 parts by weight to 0.5 parts by weight of the colloidal silica.

10. The etchant composition of claim 1, wherein the ammonium additive comprises 0.3 parts by weight to 15 parts by weight of ammonium hydroxide.

11. The etchant composition of claim 1, wherein the etchant composition comprises 30 parts by weight to 45 parts by weight of the solvent.

12. An etchant composition, comprising:

an inorganic acid;

about 0.01 parts by weight to about 0.5 parts by weight of colloidal silica;

about 0.1 parts by weight to about 20 parts by weight of an ammonium additive; and about 20 parts by weight to about 50 parts by weight of a solvent, all parts by weight being based on 100 parts by weight of the inorganic acid, wherein the colloidal silica has a structure represented by Chemical Formula 1, the structure being formed under acidic conditions at a pH of 1 or less and a temperature of 200° C. or higher:

[Chemical Formula 1]

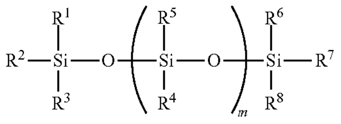

wherein, in Chemical Formula 1, m is an integer of 2 to 8, and $R^1$, $R^2$, $R^3$, $R^4$, $R^5$, $R^6$, $R^7$, and $R^8$ are each independently a hydrogen atom, a hydroxyl group, or a group represented by Chemical Formula 2, at least one of $R^1$, $R^2$, $R^3$, $R^4$, $R^5$, $R^6$, $R^7$, and $R^8$ being a hydroxyl group or a group represented by Chemical Formula 2,

[Chemical Formula 2]

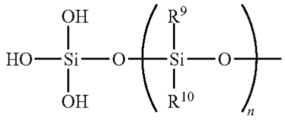

wherein, in Chemical Formula 2, n is an integer of 0 to 5, and $R^9$ and $R^{10}$ are each independently a hydrogen atom, a hydroxyl group, a C1 to C20 alkyl group, a C2 to C20 alkenyl group, a C2 to C20 alkynyl group, a C1 to C20 hydroxyalkyl group, a C1 to C20 aminoalkyl group, a C1 to C20 alkoxy group, a C1 to C20 aminoalkoxy group, a nitrile group, or a carboxyl group, and wherein the etchant composition further comprises about 0.01% by weight (wt %) to about 1 wt % of a fluorine compound, and wherein the etchant composition has a pH of 1 or less and a temperature of 200° C. or higher.

13. The etchant composition as claimed in claim 12, wherein the inorganic acid includes phosphoric acid.

14. The etchant composition as claimed in claim 13, wherein the ammonium additive includes ammonium hydroxide, ammonium chloride, ammonium acetate, ammonium phosphate, ammonium peroxydisulfate, ammonium sulfate, ammonium hydrofluoric acid salt, ammonia, or a combination thereof.

15. The etchant composition as claimed in claim 12, wherein the solvent includes deionized water.

16. The etchant composition as claimed in claim 12, further comprising about 0.01 parts by weight to about 10 parts by weight an amine compound, an azole compound, or a nitrate compound, based on 100 parts by weight of the inorganic acid.

* * * * *